United States Patent
Swanson et al.

(10) Patent No.: US 6,949,454 B2
(45) Date of Patent: Sep. 27, 2005

(54) GUARD RING STRUCTURE FOR A SCHOTTKY DIODE

(75) Inventors: Leland Swanson, McKinney, TX (US); Gregory Howard, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 103 days.

(21) Appl. No.: 10/681,400

(22) Filed: Oct. 8, 2003

(65) Prior Publication Data

US 2005/0077590 A1 Apr. 14, 2005

(51) Int. Cl.[7] .................... H01L 21/28; H01L 21/44
(52) U.S. Cl. ............................... 438/570; 257/484
(58) Field of Search .......................... 257/484; 438/570

(56) References Cited

U.S. PATENT DOCUMENTS

| | | | |
|---|---|---|---|
| 5,696,025 A | 12/1997 | Violette et al. | |
| 6,121,122 A | 9/2000 | Dunn et al. | |
| 6,399,413 B1 | 6/2002 | Krutsick | |
| 6,597,050 B1 | 7/2003 | Dunn et al. | |
| 2002/0008237 A1 | 1/2002 | Chang et al. | |
| 2002/0135038 A1 | 9/2002 | Buchanan et al. | |
| 2003/0022474 A1 * | 1/2003 | Grover et al. | 438/570 |

* cited by examiner

*Primary Examiner*—Caridad Everhart
(74) *Attorney, Agent, or Firm*—Rose Alyssa Keagy; W. James Brady, III; Frederick J. Telecky, Jr.

(57) ABSTRACT

A Schottky device having a substrate layer of a first conductivity type having a surface, and a guard ring formed over the surface of the substrate layer and also surrounding a barrier region of the substrate layer. The guard ring has a gate of a second conductivity type disposed over a dielectric layer. A metal can be formed over the barrier region to form a Schottky junction.

26 Claims, 5 Drawing Sheets

GUARD RING STRUCTURE FOR A SCHOTTKY DIODE

TECHNICAL FIELD

The present invention relates generally to processes for the manufacture of semiconductor devices and, more particularly, to the formation of a guard ring structure for a Schottky diode.

BACKGROUND OF THE INVENTION

Schottky diodes have been used for many years in the semiconductor industry in, for example, electronic systems, such as amplifiers, receivers, control and guidance systems, power and signal monitors, and as rectifiers and clamps in RF circuits. Commercial applications include radiation detectors, imaging devices, and wired and wireless communications products. A Schottky diode can be formed by the connection of a metal or silicide layer to a doped semiconductor layer. A Schottky junction (or Schottky barrier) is formed at the junction of the metal layer and the doped semiconductor layer.

Schottky diodes are prone to high electric field regions at the ion implant regions where the metal or silicide of the diode structure meets the isolation structure. Typically, these electric field regions prohibit the diode from performing at its optimum characteristic level. Parameters that are adversely affected by this field include the reverse bias leakage current and breakdown voltage.

Current approaches at eliminating the high electric field regions near the isolation barrier consist of adding a pn diode guard ring at the edge of the isolation structure. In the case of an n-type Schottky diode, the p-type guard rings are implanted into the n-type regions at the perimeter of the Schottky contact region. This provides for a better diode; however, it increases the capacitance of the device and adds a minority carrier injection mechanism into the device, which in turn increases the diode recovery time. Additionally, fabrication of such a guard ring typically requires an additional masking step.

SUMMARY OF THE INVENTION

The present invention relates to a Schottky device and a fabrication method for the Schottky device. The Schottky device includes a semiconductor substrate of a first conductivity type and a metal in contact with the semiconductor substrate. The metal and the semiconductor substrate can form a Schottky junction. A guard ring structure can be formed on the semiconductor substrate that surrounds the Schottky junction. The guard ring structure comprises a gate of a second conductivity type that overlies a gate dielectric layer. The gate and the gate dielectric form a metal oxide semiconductor (MOS) structure with the semiconductor substrate that surrounds the Schottky junction. The MOS structure creates a MOS depletion region under the gate dielectric. The MOS depletion region mitigates perimeter edge effects at the edges of the Schottky junction that are due to the high electric field generated by the curved depletion boundary.

BRIEF DESCRIPTION OF THE DRAWINGS

The foregoing and other aspects of the present invention will become apparent to those skilled in the art to which the present invention relates upon reading the following description with reference to the accompanying drawings.

DETAILED DESCRIPTION

Figure 1:
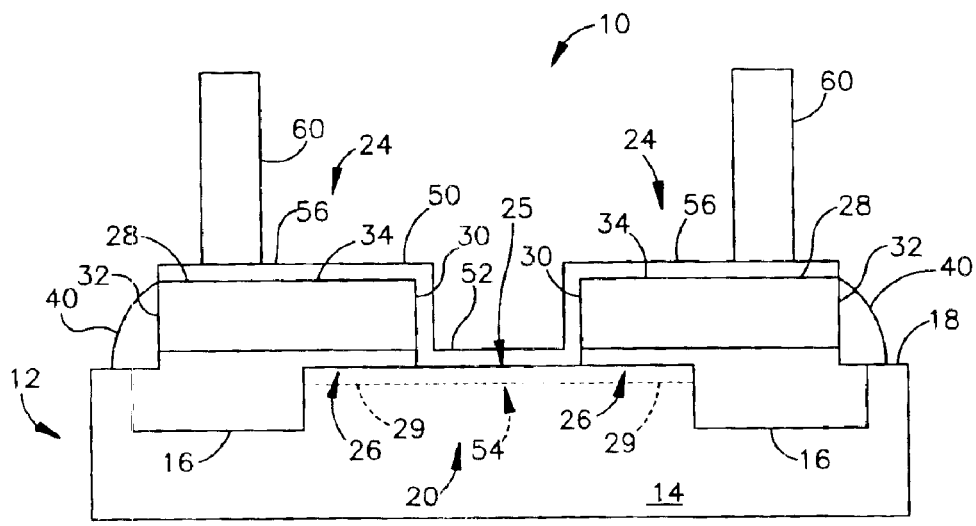
FIG. 1 illustrates a schematic cross-sectional view of a Schottky device in accordance with an aspect of the invention.

In describing the embodiments of the present invention, reference will be made herein to FIGS. 1–13 of the drawings in which like numerals refer to like features of the invention. Features of the invention are not necessarily shown to scale in the drawings.

The present invention relates generally to a Schottky device and a fabrication method for the Schottky device. The Schottky device includes a semiconductor substrate of a first conductivity type and a metal in contact with the semiconductor substrate. The metal and the semiconductor substrate can form a Schottky junction or a Schottky barrier. After the metal is placed on a surface of the semiconductor substrate, charge can be exchanged to equilibrate the Fermi energy. Since the semiconductor substrate contains substantially less charge than the metal, the donor state is empty producing a depleted region with a curved depletion boundary below the metal in the semiconductor substrate.

A guard ring structure can be formed on the semiconductor substrate that surrounds the Schottky junction. The guard ring structure comprises a gate of a second conductivity type that overlies a gate dielectric. The gate and the gate dielectric form a metal oxide semiconductor (MOS) structure with the semiconductor substrate that generally surrounds the Schottky junction. The MOS structure forms a MOS depletion region under the gate dielectric. The MOS depletion region mitigates perimeter edge effects at the edges of the Schottky junction that are due to the high electric field generated by the curved depletion boundary. Mitigation of the perimeter edge effects can increase the breakdown voltage of the Schottky device and improve the leakage characteristics of the Schottky junction.

FIG. 1 illustrates a schematic cross-sectional view of a Schottky device 10 in accordance with an aspect of the invention. The Schottky device 10 can be formed of a semiconductor substrate 12 having embedded therein an n-well 14. The semiconductor substrate 12 can be a p-type semiconductor material and the n-well 14 can be formed in the p-type semiconductor material, for example, by implanting an n-type dopant, such as phosphorous (P), in the p-type semiconductor substrate 12. It is to be appreciated that the Schottky device 10 is provided for illustrative purposes and that the semiconductor substrate 12 can include a plurality of Schottky devices and other integrated circuit devices.

The Schottky device 10 can include an isolation region 16 that is formed in the semiconductor substrate 12. The isolation region 16 can be recessed in the semiconductor substrate 12 so that the isolation region 16 does not extend substantially above a surface 18 of the semiconductor substrate 12. The isolation region 16 can define a perimeter that provides some isolation between the Schottky 10 and other semiconductor devices that can potentially be formed on or in the semiconductor substrate 12. The isolation region 16 can also define an n-moat region 20 within the semiconductor substrate 12. The n-moat region 20 comprises the active region of the Schottky device 10. The isolation region 16 can comprise shallow trench isolation structures (STI) that are formed in the semiconductor substrate by any known process, such as etching the substrate and depositing a recessed oxide (ROX) for isolation. Although an STI structure is illustrated in FIG. 1, other isolation structures may be used with the present invention, such as field oxide structures.

A guard ring structure 24 can be formed at least partially over the isolation region 16 and the n-moat region 20. The guard ring structure 24 surrounds a barrier region 25 of the semiconductor substrate. The term "ring" is conventionally used, and is used herein to describe generally any shape that generally surrounds the barrier region 25 to provide necessary isolation. Typically, this guard ring structure 24 is substantially circular or has a polygonal (e.g., rectangular) shape, although other shapes are possible.

The guard ring structure 24 includes a relatively thin gate dielectric layer 26 (e.g., having a uniform thickness between about 5 Å and about 500 Å) that can be formed (e.g., by thermal oxidation) over a portion the n-moat region adjacent the isolation region 16. The gate dielectric layer 26 can be an oxide (e.g., silicon dioxide ($SiO_2$)) or any other dielectric material suitable for use as an insulator in a MOS device. The guard ring structure 24 can also include a relatively thin gate 28 (e.g., having a uniform thickness between about 300 Å and about 700 Å). The thin gate 28 is thin to facilitate the formation of a continuous silicide from the thin gate 28 to the barrier region 25. The gate 28 can comprise, for example, a polysilicon gate material or a re-crystallized polysilicon gate material that is doped with a p-type dopant (e.g., $B_{11}$ and $BF_2$). The gate 28 can be formed (e.g., by chemical vapor deposition (CVD)) over the gate dielectric layer 26 and at least part of the isolation region 16. The gate 28 has an inner side surface 30, an outer side surface 32, and a top surface 34 that interconnects the inner side surface 30 and the outer side surface 32. The inner side surface 30 can have a substantially undulating shape (not shown) with a plurality of protrusions (not shown) that can extend into the barrier region 25 and/or a plurality of grooves that extend into the inner side surface 30. The undulating shape of the inner side surface 30 mitigates formation of a sidewall spacer along the inner side surface 30 of the gate 28 in the vicinity of sharp protrusions.

The gate 28, the gate dielectric layer 26, and the semiconductor substrate 12 can form a MOS structure. The MOS structure can create MOS depletion region 29 under the gate dielectric 26, that mitigates MOS capacitance as well as perimeter edge effects, which are due to a high electric field generated by a Schottky junction of the Schottky device 10. Mitigation of the perimeter edge effects can increase the breakdown voltage of the Schottky device 10 and improve the leakage characteristics of the Schottky junction.

The guard ring structure 24 can also include a sidewall spacer 40. The sidewall spacer 40 can extend from the gate 28 over a portion of the isolation region 16. The sidewall spacer 40 can contact the gate 28 substantially along the outer side surface 32 of the gate 28. The sidewall spacer 40 can comprise a nitride material, such as silicon nitride ($Si_3N_4$). The sidewall spacer 40 can be formed by, for example, CVD of a silicon nitride material followed by dry plasma etching of the deposited silicon nitride.

A Schottky barrier metal layer 50 can cover the barrier region 25 and extend over the inner side surface 30 and the top surface 34 of the gate 24. The Schottky barrier metal layer 50 can comprise a refractory metal that, when deposited (e.g., physical vapor deposition (PVD)) on the barrier region 25 of the semiconductor substrate 12 and the gate 28, forms a silicide material upon high temperature (e.g., greater than about 800° C.) annealing. A first portion 52 of the Schottky barrier metal layer 50 overlying the barrier region 25 can form the Schottky junction with the barrier region 25 of the semiconductor substrate 12. The Schottky junction can create a depletion region 54 that extends below the first portion 52 of the Schottky barrier metal layer 50 to the MOS depletion region 29. A second portion 56 of the Schottky barrier metal layer 50 can form an ohmic contact surface over the inner side surface 30 and the top surface 34 of the gate 24.

Contacts 60 (e.g., aluminum electrodes) to the Schottky barrier metal layer 50 can be formed (e.g., by CVD) over the guard ring structure 24. The contacts 60 can form an ohmic contact with the second portion 56 of the Schottky barrier metal layer 50. By forming the contacts 60 over the guard ring structure 60 instead of over the barrier region 25, damage to the Schottky barrier metal layer 50 that could potentially occur during formation of the contacts 60 should not affect the Schottky junction and, hence, the performance of the Schottky device should not be adversely affected.

Figure 2:
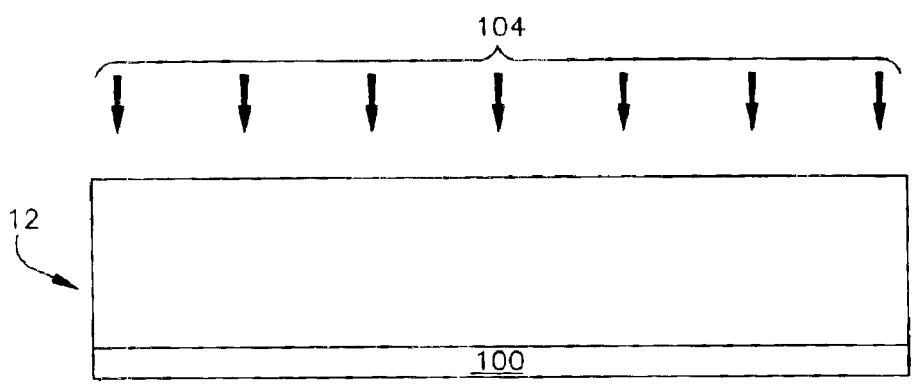
FIG. 2 illustrates a schematic cross-sectional view of an n-type buried layer being formed in a substrate.

FIGS. 2–10 illustrate a methodology of fabricating part of a Schottky device similar to the Schottky device of FIG. 1. Referring to FIG. 2, an n-buried layer 100 can be formed in a p-type substrate layer 12 by an implanting process 104 that implants an n+ type dopant, such as phosphorous and/or arsenic, into the p-type substrate layer 12. The p-type substrate layer 12 can be formed from a semiconductor material, such as silicon. The substrate layer 12, however, could be formed from any material, such as gallium arsenide, germanium, silicon-germanium, epitaxial formations, silicon carbide, indium phosphide, silicon-on-insulator substrates (SOI), strained Si substrates, and/or other semiconductor substrate materials.

The implantation of the n+ type dopant can be performed, for example, using an ion implanter that accelerates the dopant ions (e.g., P) at a high energy (e.g., greater than about 200 keV). In an aspect of the invention, the n+ type buried layer 100 can be formed by implanting a phosphorous implant at doses of about $1\times10^{13}$ cm$^2$ to about $1\times10^{15}$ cm$^2$ at energies of about 850 keV to about 1200 keV.

Figure 3:
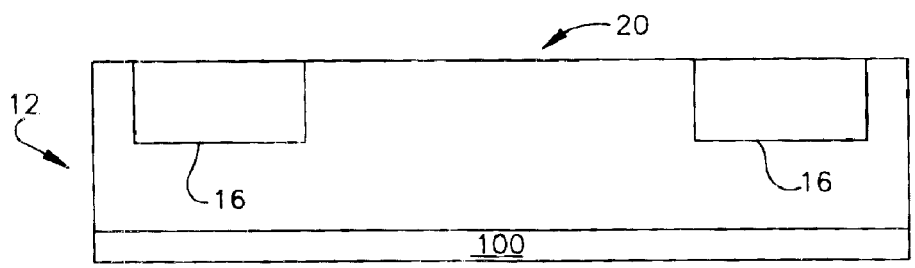
FIG. 3 illustrates a schematic cross-sectional view of the structure of FIG. 2 after an isolation region has been formed in the substrate.

FIG. 3 illustrates an isolation region 16 in the substrate layer 12 following formation of the n+ type buried layer 100. The isolation region 16 can define a perimeter of a moat region 20 where a Schottky junction can be formed. The isolation region 16 can provide some electrical isolation between the moat region 20 and adjacent regions to be used for the formation of additional semiconductor devices. The isolation region 16 can comprise a shallow trench isolation (STI) structure. The STI structure can be formed by etching (e.g., dry plasma etching) the substrate layer 12, depositing (e.g., CVD) a recessed oxide (ROX), and polishing the deposited ROX using a chemical mechanical planarization (CMP) technique (e.g., trench oxide polish). The ROX can be, for example, SiO$_2$ or another suitable oxide material that can perform the operation associated with the isolation region. Those skilled in the art will understand and appreciate other deposition techniques that can be employed to grow an ROX, such as those identified above. It is to be further understood and appreciated that other materials could be employed to form the isolation region 16 and that other isolation structures may be used with the present invention.

Figure 4:
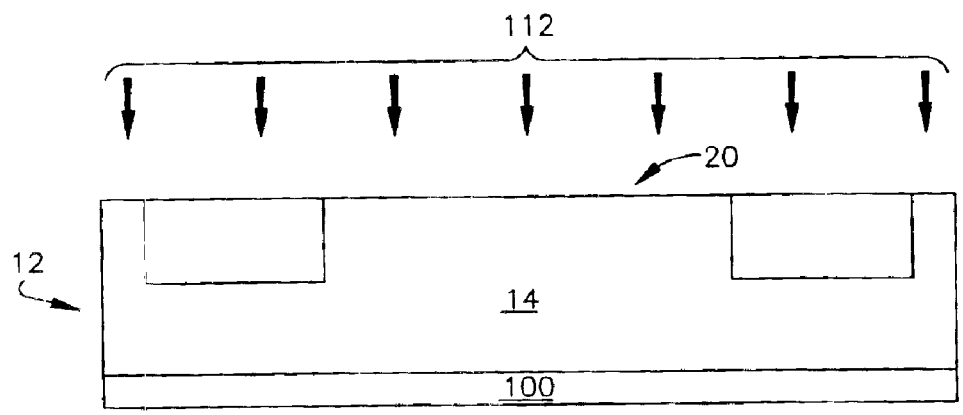
FIG. 4 illustrates a schematic cross-sectional view of the structure of FIG. 3 undergoing implantation of an n-well implant.

FIG. 4 illustrates that after formation of the isolation region 16, an n-well 114 can be formed in the substrate layer 12 by an implanting process 112 that implants an n-type dopant, such as phosphorous and/or arsenic, into the substrate layer 12. The n-well implant defines the background doping concentration of the moat region 20.

The implantation of the n-well 14 can be performed, for example, using an ion implanter (not shown) that accelerates the dopant ions (e.g., P) at a high energy (e.g., about 350 to about 850 keV). In an aspect of the invention, the n-well 14 can be formed with multiple implants. The well implant can be a high-energy implant that forms a deep low resistance region in the n-well. This low resistance region keeps the voltage close to ground everywhere in the n-well 14 and helps prevent transient voltages from building up. The well implant may comprise a phosphorous implant at doses of about $2\times10^{13}$ cm$^2$ to about $9\times10^{13}$ cm$^2$ at energies of about 350 keV to about 850 keV.

Figure 5:
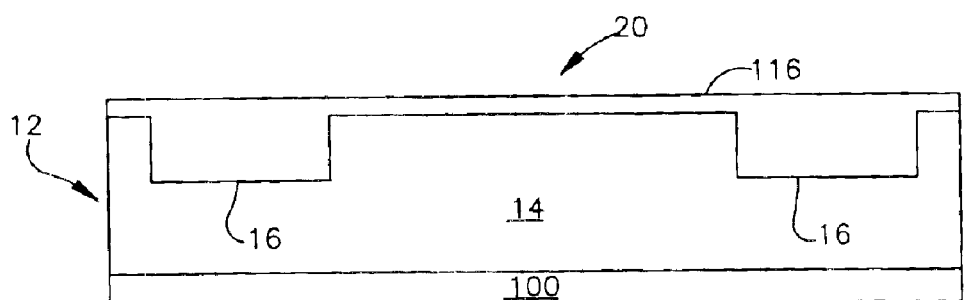
FIG. 5 illustrates a schematic cross-sectional view of the structure of FIG. 4 after a dielectric layer has been formed over the substrate.

FIG. 5 illustrates a dielectric layer 116 formed over the n-well 14 and the isolation region 16. The dielectric layer 116 can be formed by an oxidation process, which forms an oxidation layer (e.g., silicon dioxide (SiO$_2$) layer). The dielectric layer 116 can have a thickness of about 5 Å to about 500 Å, and be formed by a wet and/or dry thermal oxidation process. Thermal oxidation is the standard method of forming a dielectric layer 116 having a thickness of about 5 Å to about 500 Å. It is to be appreciated that alternate methodologies besides thermal oxidation can be employed to form the dielectric layer 116. For example, any suitable technique (e.g., plasma enhanced CVD, thermal enhanced CVD and spin on techniques) may be employed in forming the gate dielectric layer 116.

Additionally, alternate materials can be employed to provide the dielectric layer 116. The dielectric layer can comprise the same material as the isolation region 16. The dielectric layer 116 can be, for example, SiO$_2$ or another suitable oxide material that can perform the operation associated with the dielectric layer 116. Those skilled in the art will understand and appreciate appropriate types of deposition techniques that can be employed to grow suitable crystalline structures to form the dielectric layer 116, such as those identified above. It is to be further understood and appreciated that other materials also could be employed to form the dielectric layer 116.

Figure 6:
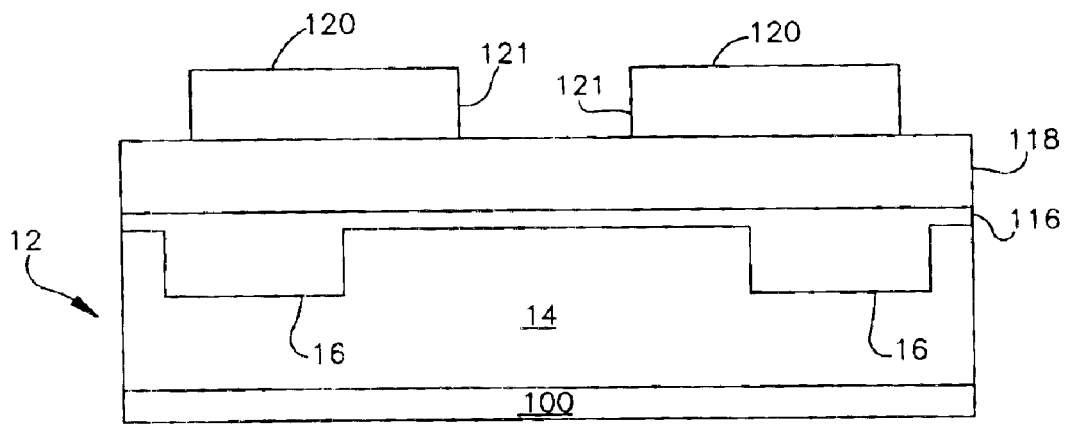
FIG. 6 illustrates a schematic cross-sectional view of the structure of FIG. 5 after a conductive layer and a patterned photo resist has been formed over the dielectric layer.

FIG. 6 illustrates a conductive layer 118 and a patterned photoresist layer 120 deposited over the dielectric layer 116. The conductive layer 118 can have a thickness of about 300 Å to about 700 Å (e.g., about 500 Å). The conductive layer 118 can be doped with a p-type dopant, such as B$_{11}$ and BF$_2$. If the conductive layer 118 is comprised of polysilicon, the conductive layer 118 may be formed using any suitable technique including CVD techniques, such as low-pressure CVD (LPCVD) or plasma enhanced CVD (PECVD). The polysilicon can be formed in a polycrystalline state or an amorphous state, which is later, converted to a crystalline state. If the conductive layer 118 is comprised of amorphous silicon or germanium, standard deposition techniques may be employed. After layer 118 is deposited, it can be implanted with a p-type dopant. To save patterning masks, and be able to use the p source/drain (PSD) implant, the implanted area can be patterned using the PSD mask. Lower gate dopant concentrations and conductivities can be achieved.

The patterned photoresist layer 120 can have a thickness suitable for carrying out the present invention. Accordingly, the thickness of the patterned photoresist layer 120 can vary in correspondence with the wavelength of radiation used to pattern the photoresist layer 120. The patterned photoresist layer 120 can be formed by providing a photoresist layer over the conductive layer 118 via conventional spin-coating or spin casting deposition techniques. The photoresist layer can be etched (e.g., anisotropic reactive ion etching (RIE)) to provide the patterned photoresist layer 120. A selective etch technique can be used to etch the photoresist layer at a relatively greater rate as compared to the rate of the underlying conductive layer 118 to provide the patterned photoresist layer 120. The patterned photoresist layer 120 can be used as a mask to define an area of a gate of a guard ring structure during a subsequent etching processing. An inner surface 121 of the patterned photoresist layer 120 can have an undulating shape (not shown) so that when the gate is formed (e.g., by etching the conductive layer 118 and the dielectric layer 116), an inner surface of the gate will have a substantially undulating shape.

Figure 7:
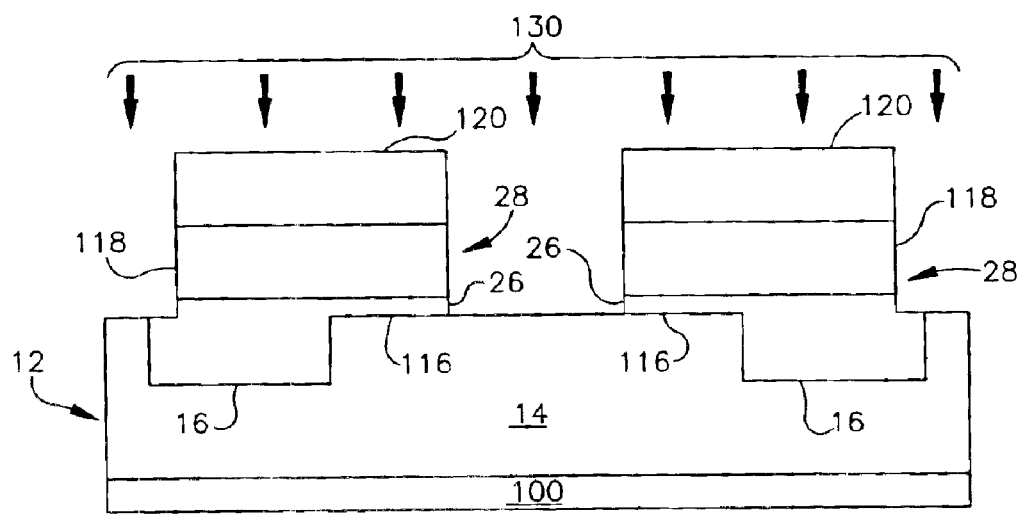
FIG. 7 illustrates a schematic cross-sectional view of the structure of FIG. 6 after an etching process has been initiated to etch the conductive layer and the dielectric layer.

FIG. 7 illustrates an etching process 130 being performed to remove a portion of the conductive layer 118 and the dielectric layer 116 to form a gate 28 and gate dielectric 21. Any suitable etch technique can be used to etch the conductive layer 118 and the dielectric layer 116. For example, the conductive layer 118 and dielectric layer 116 can be anisotropically etched with a plasma gas(es), (e.g., carbon tetrafluoride (CF$_4$) containing fluorine ions) in a commercially available etcher, such as a parallel plate RIE apparatus or, an electron cyclotron resonance (ECR) plasma reactor. Any combination of a wet or dry etch process can be employed to etch the conductive layer 118 and the dielectric layer 116. In one aspect, a selective etch technique is used to etch the conductive layer 118 and the dielectric layer 116 at a relatively greater rate as compared to the rate of the patterned photoresist layer 120.

Following formation of the gate 28 and gate dielectric 26, the patterned photoresist layer 120 can be stripped off the gate 28 (e.g., Ultra-Violet (UV)/Ozone (O$_3$)/Sulfuric Acid (H$_2$SO$_4$) and cleaned by wet chemical cleanup processes. Those skilled in the art would be familiar with a variety of different cleanup procedures that can be employed to clean the structure.

Figure 8:
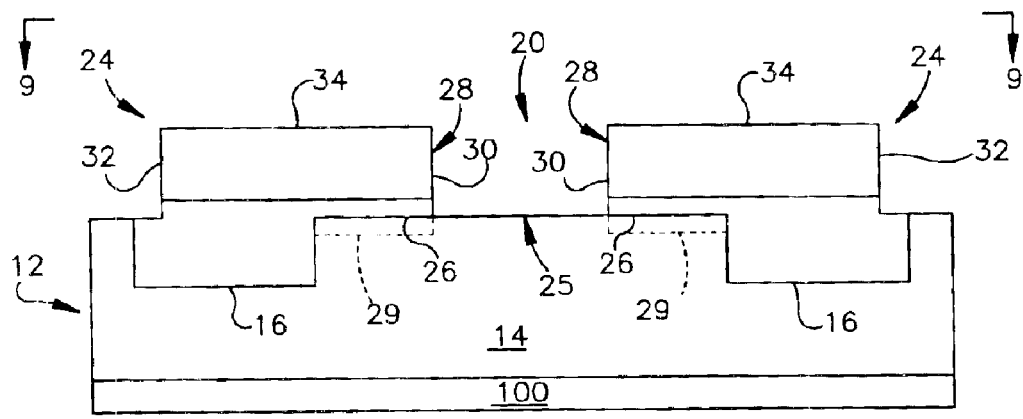
FIG. 8 illustrates a schematic cross-sectional view of the structure of FIG. 7 after the patterned photoresist has been removed from the conductive layer.
Figure 9:
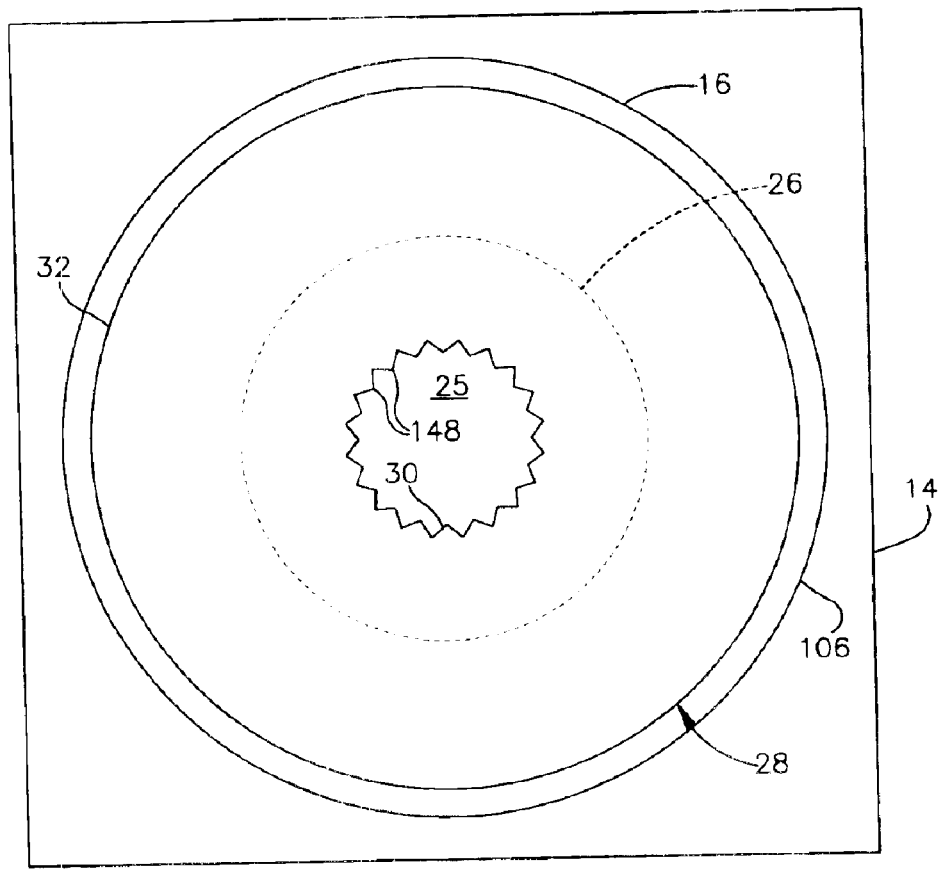
FIG. 9 illustrates a schematic top plan view of the structure of FIG. 8.

FIG. 8 illustrates the substrate 12 after the patterned photoresist 120 has been removed. The gate 28 and gate dielectric 26 can form a guard ring structure 24. The guard ring structure 24 can define a barrier region 25 in the moat region 20 for the formation of a Schottky junction (or Schottky barrier). The gate 28 and the gate dielectric 26 of the guard ring structure 24 can form a metal oxide semiconductor (MOS) structure. The MOS structure can create a MOS depletion region that mitigates perimeter edge effects of the Schottky junction. The gate 28 of the guard ring structure 24 can extend partially over the isolation region 16 and the moat 20. The gate 28 can have an inner side surface 30, an outer side surface 32, and a top surface 34 that connects the inner side surface 30 and the outer side surface 32. Referring to FIG. 9, which is a top plan view of FIG. 8, the inner side surface 30 of the gate 28 can have a substantially undulating shape with a plurality of protrusions 148 that extend into the barrier region 25 and/or a plurality of grooves that extend into the side surface 30. The protrusions 148 (or grooves) can mitigate formation of a sidewall spacer at the extremities of the protrusions on the inner side surface 30 of the gate 28 during subsequent processing.

Figure 10:
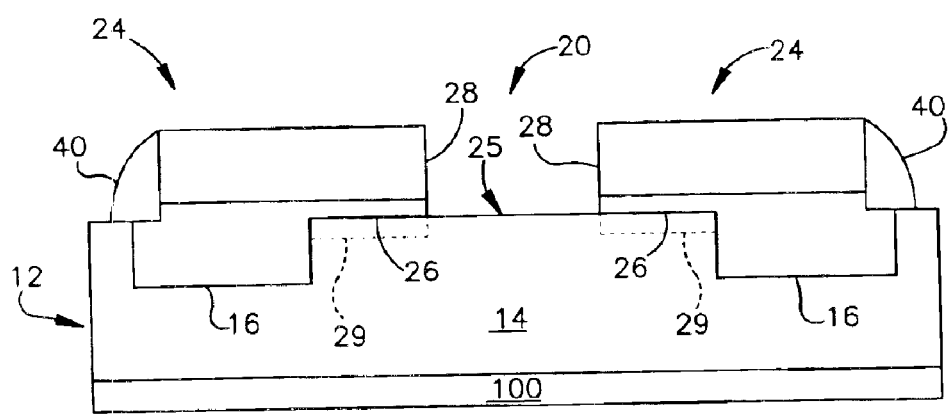
FIG. 10 illustrates a schematic cross-sectional view of the structure FIG. 8 after a sidewall spacer has been formed.

FIG. 10 illustrates that a sidewall spacer 40 can be formed, which contacts the outer side surface 32 of the gate 28. The sidewall spacer 40 can extend laterally from the outer side surface 32 of the gate so that it overlies part of the isolation region 16 and the substrate layer 12. The sidewall spacer 40 can comprise an insulating material, such as silicon dioxide or silicon nitride. It is to be further understood and appreciated the sidewall spacer 40 can comprise other materials. The sidewall spacer 40 can be formed by depositing a film of the insulating material over the guard ring structure 24 and moat region 20 using any suitable technique including CVD techniques, such as LPCVD or PECVD. Other deposition techniques, such as sputtering techniques can also be used. Following deposition of the film of insulating material, the film can be etched (e.g., anisotropic reactive ion etching (RIE)) to provide the sidewall spacer 40 on the outer side surface 32 of the gate 28. For example, a silicon nitride film can be anisotropically etched with a plasma gas(es), (e.g., carbon tetrafluoride ($CF_4$) containing fluorine ions) in a commercially available etcher, such as a parallel plate RIE apparatus or, an electron cyclotron resonance (ECR) plasma reactor. The film covering the protrusions 148 (FIG. 9) of the inner side surface 30 of the gate 28 can be readily etched from the extremities of the protrusions 148 to mitigate the formation of a sidewall spacer along the inner side surface 30 of the gate 28.

Figure 11:
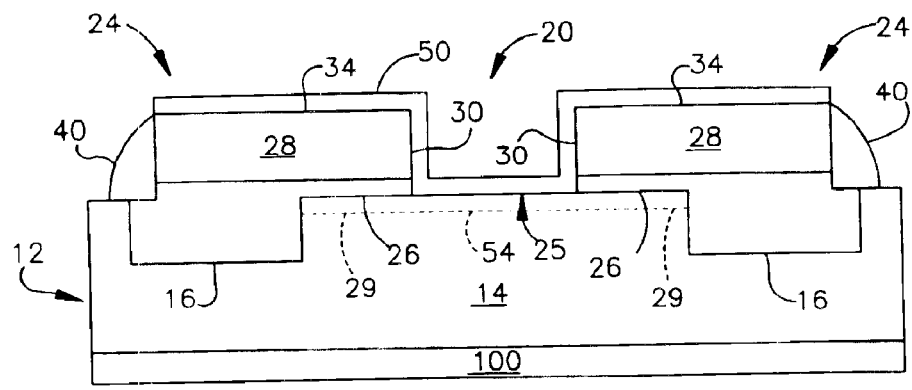
FIG. 11 illustrates a schematic cross-sectional view of the structure of FIG. 10 after a barrier layer has been formed over the conductive layer and the substrate.

FIG. 11 illustrates that a Schottky barrier metal 50 can be deposited over the gate 28 and barrier region 135. In this example, a continuous layer of the Schottky barrier metal 50 can be formed over the top surface 34 of the gate 28, the inner side surface 30 of the gate 28, and the barrier region 25. The Schottky barrier metal layer 50 can form a Schottky junction with the substrate layer 12 of the barrier region 25. The Schottky junction can create a depletion region 54 that extends under Schottky junction to the MOS depletion region 29. The Schottky barrier metal 50 can also form a contact region over the gate 28. The Schottky barrier metal can comprise a refractory metal that can be alloyed by a thermal anneal process (e.g., rapid thermal anneal (RTA) at a temperature greater than about 800° C.) with the silicon of the semiconductor substrate 12 and the polysilicon of the gate 28 to form a continuous silicide layer. Refractory metals typically do not react with oxides or nitrides so the refractory metals can be easily etched off the sidewall spacer 40 following alloying. Examples of metals that can be deposited and alloyed to form the silicide can include cobalt, molybdenum, platinum, tantalum, titanium, and tungsten. Other metals that can be deposited and alloyed with the silicon can also be used.

Following deposition of the Schottky barrier metal 50 to form the Schottky junction and the ohmic contact, contacts (not shown) to the Schottky barrier metal 50 can be formed. The contacts can be provided over the guard ring structure 24. The contacts can be an electrode that is formed from a metal, such as aluminum, aluminum alloy, copper, copper alloy, tungsten by conventional deposition techniques. By forming the contact to the Schottky junction over the guard ring structure 24, potential damage to the Schottky junction can be mitigated. The resultant structure is similar to the structure illustrated in FIG. 1.

Figure 12:
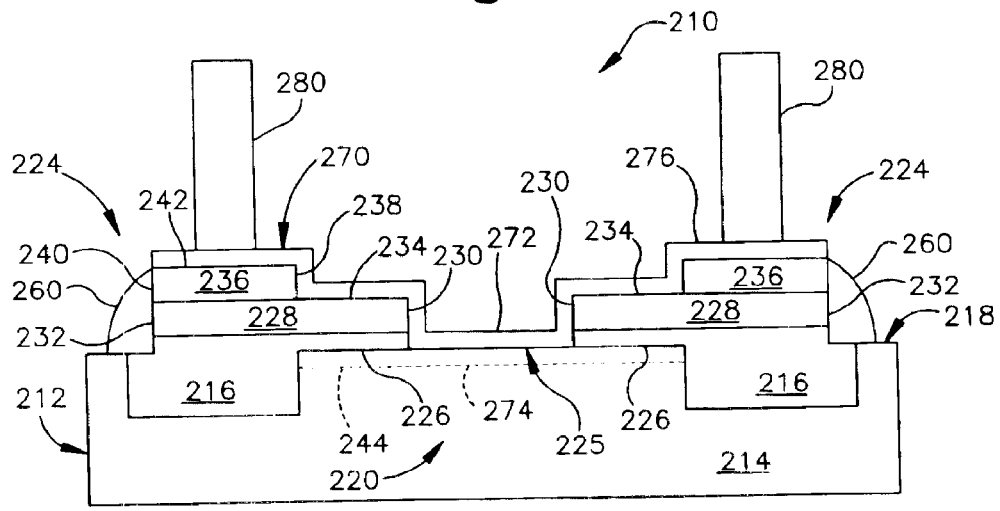
FIG. 12 illustrates a schematic cross-sectional view of a Schottky device in accordance with another aspect of the invention.

FIG. 12 illustrates a schematic cross-sectional view of a Schottky device 210 in accordance with another aspect of the invention. The Schottky device 210 in accordance with this aspect can have a structure similar to the structure of the Schottky device 10 (FIG. 1) except that a guard ring structure of the Schottky device 210 (FIG. 12) comprises a plurality (e.g., at least two) of overlying (i.e., stacked) gates. The plurality of gates can be aligned so that a guard ring structure can be formed having a substantially stepped-shape. The thickness of the each of the gates can also be substantially less than the thickness of the gate 28 (FIG. 1) so that each gate has an inner side surface (i.e., edge) with a substantially reduced thickness compared to the inner side surface 30 of the gate 28 (FIG. 1). The stepped-shape guard ring structure and the reduced inner side surface of each of the gates can mitigate formation of a nitride sidewall on the inner side surfaces of the gates by allowing nitride material, which is deposited on the gates during fabrication, to be more readily etched from the inner side surfaces of the gates compared to outer surfaces of the gates. The substantial absence of a sidewall on the inner side surface of gates can facilitate the formation of a continuous silicide layer from the gates to a barrier region.

Referring again to FIG. 12, the Schottky device 210 can be formed of a semiconductor substrate 212 having embedded therein an n-well 214. The semiconductor substrate 212 can be a p-type semiconductor material and the n-well 214 can be formed in the p-type semiconductor material, for example, by implanting an n-type dopant, such as phosphorous (P), in the p-type semiconductor substrate 212. It is to be appreciated that the Schottky device 210 is provided for illustrative purposes and that the semiconductor substrate 212 can include a plurality of Schottky devices and other integrated circuit devices.

The Schottky device 210 can include an isolation region 216 that is formed in the semiconductor substrate 212. The isolation region can be recessed in the semiconductor substrate 212 so that the isolation region 216 does not extend substantially above a surface 218 of the semiconductor substrate 212. The isolation region 216 can define a perimeter that provides some isolation between the Schottky device and other semiconductor devices that can potentially be formed on the semiconductor substrate 212. The Schottky device 210 can also define an n-moat region 220 within the semiconductor substrate 212. The n-moat region 220 comprises the active region of the Schottky device 210. The isolation region 216 can comprise STI structures that are formed in the semiconductor substrate by any known process, such as etching the substrate and depositing a ROX for isolation. Although an STI structure is illustrated in FIG. 12, other isolation structures may be used with the present invention.

A guard ring structure 224 can be formed at least partially over the isolation region 216 and the n-moat region 220. The guard ring structure 224 surrounds a barrier region 225 of the semiconductor substrate 212. The guard ring structure 224 has a substantially stepped-shape structure that can facilitate formation of a continuous silicide over the guard ring structure 224 to the barrier region 225.

The guard ring structure 224 includes a relatively thin gate dielectric layer 226 (e.g., having a uniform thickness between about 5 Å and about 500 Å) that can be formed (e.g., by thermal oxidation) over a portion the n-moat region 220 adjacent the isolation region 216. The gate dielectric layer 226 can be an oxide (e.g., silicon dioxide ($SiO_2$)) or any other dielectric material suitable for use as an insulator in a MOS device. The guard ring structure 224 can also include a first relatively thin gate 228 (e.g., having a uniform thickness between about 300 Å and about 700 Å). The first relatively thin gate can be formed (e.g., by CVD) over the gate dielectric layer 226 and at least part of the isolation region 216. The first gate 228 can have an inner side surface 230, an outer side surface 232, and a top surface 234 that interconnects the inner side surface 230 and the outer side surface 232. The inner side surface 230 can have a substantially undulating shape (not shown) with a plurality of protrusion (not shown) that can extend into the barrier region 225. The undulating shape of the inner side surface 230 can mitigate formation of a sidewall spacer at the extremities of protrusions along the inner side surface 230 of the first gate 228. The first gate 228 can comprise, for example, a polysilicon gate material or a re-crystallized polysilicon gate material that is doped with a p-type dopant (e.g., $B_{11}$ and $BF_2$).

The guard ring structure 224 can also include a second relatively thin gate 236 (e.g., having a uniform thickness between about 300 Å and about 700 Å). The second relatively thin gate 236 can be formed (e.g., by CVD) over the first gate 228. The second gate 236 can be substantially narrower than the first gate 228 and can be substantially aligned over the isolation region 216 to provide the substantially stepped-shape gate structure. The second gate 236 can have an inner side surface 238, an outer side surface 240, and a top surface 242 that interconnects the inner side surface 238 and the outer side surface 240. The inner side surface 238 can have a substantially undulating shape (not shown) with a plurality of protrusion (not shown) that can extend into the first gate region 234. The undulating shape of the inner side surface 238 can mitigate formation of a sidewall spacer at the extremities of protrusions along the inner side surface 238 of the second gate 236. The second gate 236 can comprise, for example, a polysilicon gate material or a re-crystallized polysilicon gate material that is doped with a p-type dopant (e.g., $B_{11}$ and $BF_2$).

It will be appreciated by one skilled in the art that additional gates (e.g., one or more additional gates) can be provided over the first gate 228 and the second gate 236. These additional gates can form additional steps for the stepped-shape guard ring structure 224. The additional steps can further mitigate the formation of a sidewall on the inner side surfaces of the gates and facilitate formation of a continuous silicide from the gates to the barrier region 225.

The first gate 228, the second gate 236, the gate dielectric layer 226, and the semiconductor substrate 212 can form a MOS structure. The MOS structure can create a MOS depletion region 244 under the gate dielectric 226, that mitigates MOS capacitance as well as perimeter edge effects, which are due to a high electric field generated by a Schottky junction of the Schottky device 210. Mitigation of the perimeter edge effects can increase the breakdown voltage of the Schottky device 210 and improve the leakage characteristics of the Schottky junction.

The guard ring structure 224 can also include a sidewall spacer 260. The sidewall spacer 260 can extend from the gates 236 and 238 over a portion of the isolation barrier 216. The sidewall spacer 260 can contact the gates 228 and 236 substantially along the outer side surfaces 232 and 240 of the gates 228 and 236. The sidewall spacer 260 can comprise a nitride material, such as silicon nitride ($Si_3N_4$). The sidewall spacer 260 can be formed by, for example, by CVD of a silicon nitride material followed by dry plasma etching.

A Schottky barrier metal layer 270 can cover the barrier region 225 and extend over the inner side surface 230 and part of the top surface 234 of the first gate 228 and the inner side surface 238 and the top surface 242 of the second gate 236. The Schottky barrier metal layer can comprise a refractory metal that when deposited (e.g., PVD) on the barrier region 225 of the semiconductor substrate 212, the first gate 228, and the second gate 236 forms a silicide material upon high temperature (e.g., greater than about 800° C.) annealing. A first portion 272 of the Schottky barrier metal layer 270 overlying barrier region 225 can form the Schottky junction (or Schottky barrier) with the barrier region 225 of the semiconductor substrate 212. The Schottky junction can create a depletion region 274 that extends below the first portion 272 of the Schottky barrier metal layer 270 to the MOS depletion region 244. A second portion 276 of the Schottky barrier metal layer 270 can provide a contact surface over the top surface 242 of the second gate 236.

Contacts 280 (e.g., aluminum or tungsten electrodes) to the Schottky barrier metal layer 270 can be formed (e.g., by CVD) over the second gate 236 of the guard ring structure 224. The contacts can form an ohmic contact with the second portion 276 of the Schottky barrier metal layer 270. By forming the contacts 280 to the Schottky barrier metal layer 270 over the second gate 236 instead of the first gate 228, damage that could potentially occur during formation of the contacts should not affect MOS structure and the Schottky junction and, hence, the performance of the Schottky device should not be adversely effected.

Figure 13:
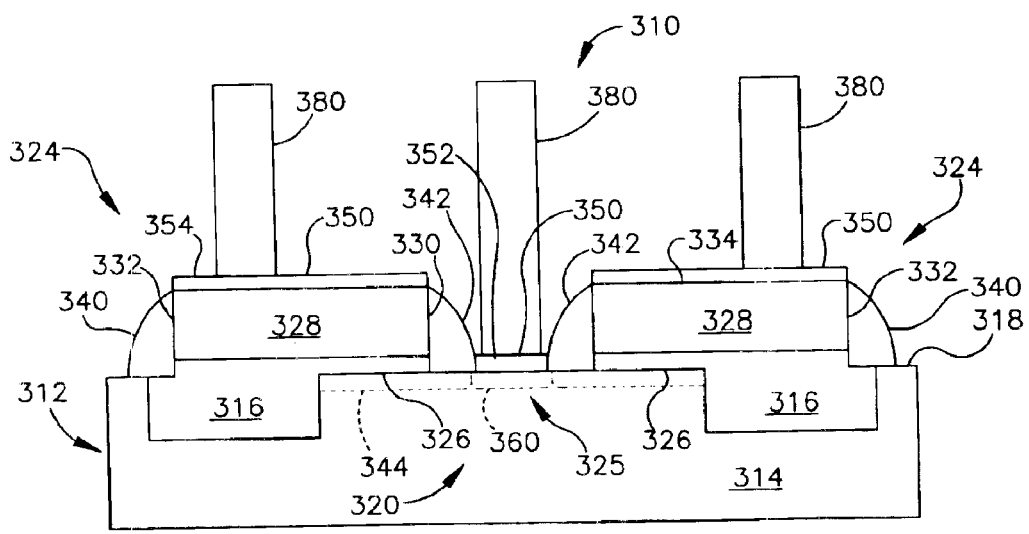
FIG. 13 illustrates a schematic cross-sectional view of a Schottky device in accordance with yet another aspect of the invention.

FIG. 13 illustrates a schematic cross-sectional view of a Schottky device 310 in accordance with yet another aspect of the invention. The Schottky device 310 in accordance with this aspect can have a structure similar to the structure of the Schottky device 10 (FIG. 1) except that a sidewall can be provided on an inner side surface of a gate of a guard ring structure. Formation of a sidewall on the inner side surface of the gate can obviate the formation of a continuous silicided layer from the gate of the guard ring structure to a barrier region of the Schottky device. A contact can then be provided with the silicide overlying the barrier region as well as the silicide overlying the guard ring structure.

Referring again to FIG. 13, the Schottky device 310 can be formed of a semiconductor substrate 312 having embedded therein an n-well 314. The semiconductor substrate 312 can be a p-type semiconductor material and the n-well 314 can be formed in the p-type semiconductor material, for example, by implanting an n-type dopant, such as phosphorous (P), in the p-type semiconductor substrate 312. It is to be appreciated that the Schottky device 310 is provided for illustrative purposes and that the semiconductor substrate 312 can include a plurality of Schottky devices and other integrated circuit devices.

The Schottky device 310 can include an isolation region 316 that is formed in the semiconductor substrate 312. The isolation region 316 can be recessed in the semiconductor substrate so that the isolation region does not extend substantially above a surface 318 of the semiconductor substrate 312. The isolation region 316 can define a perimeter structure that provides some isolation between the Schottky device 310 and other semiconductor devices that can potentially be formed on the semiconductor substrate 312. The isolation region 316 can also define an n-moat region 320 within the semiconductor substrate 312. The n-moat region 320 comprises the active region of the Schottky device 310. The isolation region 316 can comprise STI structures that are formed in the semiconductor substrate 312 by any known process, such as etching the substrate and depositing a ROX for isolation. Although an STI structure is illustrated in FIG. 13, other isolation structures may be used with the present invention.

A guard ring structure 324 can be formed at least partially over the isolation region 316 and the n-moat region 320, which is defined by the isolation region 316. The guard ring structure 324 surrounds a barrier region of the semiconductor substrate. The guard ring structure 324 includes a relatively thin gate dielectric layer 326 (e.g., having a uniform thickness between about 5 Å and about 500 Å) that can be formed (e.g., by thermal oxidation) over a portion of the n-moat region 320 adjacent the isolation region 316. The gate dielectric layer 326 can be an oxide (e.g., silicon dioxide ($SiO_2$)) or any other dielectric material suitable for use as an insulator in a MOS device.

The guard ring structure 324 can also include a relatively thin gate 328 (e.g., having a uniform thickness between about 300 Å and about 700 Å). The gate 328 can be formed (e.g., by chemical vapor deposition (CVD)) over the gate dielectric layer 326 and at least part of the isolation region 316. The gate 328 has an inner side surface 330, an outer side surface 332, and a top surface 334 that interconnects the inner side surface 330 and the outer side surface 332. The gate 328 can comprise, for example, a polysilicon gate material or a re-crystallized polysilicon gate material that is doped with a p-type dopant (e.g., $B_{11}$ and $BF_2$).

The gate 328, the gate dielectric layer 326, and the semiconductor substrate 312 can form a MOS structure. The MOS structure can create a MOS depletion region 344 under the gate dielectric 326, that mitigates MOS capacitance as well as perimeter edge effects, which are due to a high electric field generated by a Schottky junction of the Schottky device 310. Mitigation of the perimeter edge effects can increase the breakdown voltage of the Schottky device 310 and improve the leakage characteristics of the Schottky junction.

The guard ring structure 324 can also include a first sidewall spacer 340 and a second sidewall spacer 342. The first sidewall spacer 340 can extend from the gate 328 over a portion of the isolation barrier 316. The first sidewall spacer 340 can contact the gate 328 substantially along the outer side surface 332 of the gate 328. The second sidewall spacer 342 can extend from the gate 328 over a portion of the barrier region 325. The second sidewall spacer 342 can contact the gate 328 substantially along the inner side surface 330 of the gate 328. The second sidewall spacer 342 can be sized so that a depletion region created under the Schottky junction can extend under the sidewall spacer 342 to the MOS depletion region 344. The first sidewall spacer 340 and the second sidewall spacer 342 can comprise a nitride material, such as silicon nitride ($Si_3N_4$). The sidewall spacers 340 and 342 can be formed by, for example, CVD of a silicon nitride material followed by dry plasma etching.

A Schottky barrier metal layer 350 can cover the barrier region 325 and the top surface 334 of the gate 328. Unlike the previously described Schottky devices, the Schottky barrier metal layer does not extend over the inner side surface 342 of the gate 328. The Schottky barrier metal layer 350 can comprise a refractory metal that when deposited (e.g., PVD) on the barrier region 325 of the semiconductor substrate 312 and the gate 328 forms a silicide material upon high temperature (e.g., greater than about 800° C.) annealing. A first portion 352 of the Schottky barrier metal layer 350 overlying the barrier region 325 can form the Schottky junction with the barrier region 325 of the semiconductor substrate 312. The Schottky junction can create a depletion region 360 that extends below the first portion 352 of the Schottky barrier metal layer 350 to the MOS depletion region 344. A second portion 354 of the Schottky barrier metal layer 350 can provide a contact surface over the top surface 334 of the gate 328.

Contacts 380 (e.g., electrodes) to the Schottky barrier metal layer 350 can be formed (e.g., by CVD) over the guard ring structure 324 and the barrier region 325. The contacts 380 can form ohmic contacts with the Schottky barrier metal layer 350. It is desirable to form a contact over the barrier region 325 because the sidewall spacer 342 separates the first portion 352 of the Schottky barrier metal layer 350 from the second portion 354 of the metal layer 350 forming the silicide contact to the gate 328.

Those skilled in the art will also understand and appreciate that variations in the processing operations can be utilized in the formation of a gate structure in accordance with an aspect of the present invention. For example, it is to be appreciated that a p-well can be formed in an n-type substrate material and that a gate of a guard ring structure can be doped with an n-type dopant. It is further to be appreciated that a plurality of Schottky devices can be formed on the semiconductor substrate. Moreover, it is to be appreciate that the Schottky device can be fabricated on a semiconductor substrate using conventional MOS processes. Additionally, it is to be appreciated that an additional mask can be provide during fabrication of the Schottky device to prevent formation of a sidewall space on the inner side surface of the gate.

What has been described above includes examples and implementations of the present invention. Because it is not possible to describe every conceivable combination of components, circuitry or methodologies for purposes of describing the present invention, one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A Schottky device comprising:
   a substrate layer of a first conductivity type having a surface;
   a guard ring structure overlying the surface of the substrate layer and surrounding a barrier region of the substrate layer, the guard ring structure comprising a gate of a second conductivity type disposed over a gate dielectric; and
   a metal overlying the barrier region, the metal and the barrier region forming a Schottky junction, the metal having a silicide layer that includes a first portion and a second portion, the first portion of the silicide layer overlying the barrier region and the second portion of the silicide layer contacting the gate.

2. The Schottky device of claim 1, further comprising a depletion region that extends under the gate dielectric and the barrier region.

3. The Schottky device of claim 1, further comprising at least one contact contacting the second portion of the silicide layer extending over the top surface of the gate.

4. The Schottky device of claim 1, the gate comprising a first conductive layer and a second conductive layer, the second conductive layer being narrower than the first conductive layer and being aligned over the first conductive layer.

5. The Schottky device of claim 1, further comprising an isolation region formed in the substrate layer, the isolation region defining a moat region in the substrate layer, the moat region including the barrier region.

6. The Schottky device of claim 5, the gate extending over at least a portion of the isolation region.

7. The Schottky device of claim 6, the gate comprising a top surface, an inner side surface and an outer side surface, the second portion of the silicide layer extending substantially over the top surface and the inner side surface.

8. The Schottky device of claim 7, the inner side surface having a substantially undulating shape.

9. The Schottky device of claim 8, the substrate layer being doped with an n-type dopant and the gate being doped with a p-type dopant.

10. The Schottky device of claim 1, the gate comprising a top surface, an inner side surface and an outer side surface, the first portion of the silicide layer extending substantially over the top surface, the inner side surface being substantially free of the silicide layer.

11. The Schottky device of claim 10, further comprising a first contact contacting the second portion of the silicide layer extending over the top surface of the gate and a second contact contacting the first portion of the silicided layer extending over the barrier region.

12. A Schottky device comprising:
a guard ring structure disposed over a substrate layer of a first conductivity type, the guard ring structure surrounding a barrier region of the substrate layer, the guard ring structure including a gate of a second conductivity type disposed over a gate dielectric layer; and
a silicide layer including a first portion overlying the barrier region to form a Schottky junction and a second portion contacting the gate.

13. The Schottky device of claim 12, the gate comprising a first conductive layer and a second conductive layer, the second conductive layer being narrower than the first conductive layer and being aligned over the first conductive layer.

14. The Schottky device of claim 12, further comprising an isolation region formed in the substrate layer, the isolation region defining a moat region in the substrate layer, the moat region including the barrier region.

15. The Schottky device of claim 14, the gate comprising a top surface, an inner side surface, and an outer side surface, the first portion of the silicide layer extending substantially over a top surface and the inner side surface.

16. The Schottky device of claim 15, the inner side surface of the gate having a substantially undulating shape.

17. The Schottky device of claim 12, the gate comprising a top surface, an inner side surface and an outer side surface, the first portion of the silicide layer extending substantially over the top surface, the inner side surface being substantially free of the silicide layer.

18. The Schottky device of claim 17, further comprising a first contact contacting the second portion of the silicide layer extending over the top surface of the gate and a second contact contacting the first portion of the silicided layer extending over the barrier region.

19. A method of fabricating a Schottky device, the method comprising:
providing a substrate layer of a first conductivity type having a surface;
forming a guard ring structure on the substrate layer, the guard ring structure defining a barrier region in the substrate layer, the guard ring structure including a gate of a second conductivity type disposed over a gate dielectric; and
forming a metal overlying the barrier region to provide a Schottky junction, the metal having a silicide layer that includes a first portion and a second portion, the first portion of the silicide layer overlying the barrier region and the second portion of the silicide layer contacting the gate.

20. The method of claim 19, forming at least one contact contacting the second portion of the silicide layer extending over the top surface of the gate.

21. The method of claim 19, the gate comprising a top surface, an inner side surface and an outer side surface, the second portion of the silicide layer extending substantially over the top surface and the inner side surface.

22. The method of claim 21, further comprising providing the inner side surface of the gate with a substantially undulating shape.

23. The method of claim 19, the guard ring structure being formed by forming the gate dielectric layer over the substrate layer and then forming the gate over the gate dielectric layer.

24. The method of claim 23, further comprising forming a second gate over the gate disposed over the gate dielectric layer, the second gate being substantially narrower than the first gate and forming a stepped-shape gate structure with the first gate.

25. The method of claim 19, the gate comprising a top surface, an inner side surface and an outer side surface, the first portion of the silicide layer extending substantially over the top surface, the inner side surface being substantially free of the suicide layer.

26. The method of claim 25, further comprising forming a first contact contacting the second portion of the silicide layer extending over the top surface of the gate and a second contact contacting the first portion of the silicided layer extending over the barrier region.

* * * * *